United States Patent [19]

Bangham

[11] Patent Number: 5,712,807
[45] Date of Patent: Jan. 27, 1998

[54] PULSE ANALYZING METHOD AND APPARATUS

[76] Inventor: James Andrew Bangham, 26 Park Lane, Norwich, Norfolk NR2 2EE, England

[21] Appl. No.: 355,109

[22] Filed: Dec. 13, 1994

Related U.S. Application Data

[63] Continuation of Ser. No. 972,992, Nov. 10, 1993, abandoned, which is a continuation-in-part of Ser. No. 473,976, filed as PCT/GB88/00018 Oct. 21, 1988, abandoned.

[30] Foreign Application Priority Data

| Oct. 21, 1987 | [GB] | United Kingdom | 8724619 |
| Jan. 11, 1988 | [GB] | United Kingdom | 8800509 |
| Sep. 2, 1988 | [GB] | United Kingdom | 8821682 |

[51] Int. Cl.$^6$ .................................................. G06F 17/10
[52] U.S. Cl. ............................... 364/724.01; 382/262
[58] Field of Search ...................... 364/724.01, 724.16, 364/724.17; 382/262

[56] References Cited

U.S. PATENT DOCUMENTS

| 4,439,840 | 3/1984 | Coleman et al. | 395/775 |
| 4,441,165 | 4/1984 | Coleman et al. | 395/775 |
| 4,456,968 | 6/1984 | Carter et al. | 395/800 |
| 4,560,974 | 12/1985 | Coleman et al. | 340/146.2 |
| 4,603,430 | 7/1986 | Sacks | 382/28 |

OTHER PUBLICATIONS

Lee et al, "Generalized Median Filtering and Related Non-linear Filtering Techniques" *IEEE Trans. on Acoustics, Speech, and Signal Processing*, vol. ASSP-33 No. 3 Jun. 1985 pp.672–683.

*Primary Examiner*—David H. Malzahn
*Attorney, Agent, or Firm*—Lee, Mann, Smith, McWilliams, Sweeney & Ohlson

[57] ABSTRACT

A pulse analysing system for separating broadband wanted pulses of duration to include a predetermined plurality of data samples from a signal which also contains unwanted short signals, in which a data-sieve comprising a succession of ordinal signals of increasing value is employed in conjunction with pulse selection and addition of signals of a selected subset obtained from the data-sieve.

5 Claims, 8 Drawing Sheets

| SAMPLE i= | 1 | 2 | 3 | 4 | 5 | 6 | 7 | 8 | 9 | 10 | 11 | 12 | 13 | 14 | 15 | 16 | 17 | 18 | 19 | Row no. |
|---|---|---|---|---|---|---|---|---|---|---|---|---|---|---|---|---|---|---|---|---|
| DATA | 0 | 0 | 9 | 0 | 0 | 0 | 7 | 7 | 0 | 0 | 0 | 3 | 3 | 3 | 1 | 1 | 4 | 1 | 1 | 1 |
| N=3 | 0 | 0 | 0 | 0 | 0 | 0 | 0 | 0 | 0 | 0 | 0 | 3 | 3 | 3 | 1 | 1 | 1 | 1 | 1 | 2 |
| N=3,3 | 0 | 0 | 0 | 0 | 0 | 0 | 0 | 0 | 0 | 0 | 0 | 3 | 3 | 3 | 1 | 1 | 1 | 1 | 1 | 3 |
| N=2,3 | 0 | 0 | 0 | 0 | 0 | 0 | 0 | 0 | 0 | 0 | 0 | 3 | 3 | 1 | 1 | 1 | 1 | 1 | 1 | 4 |
| SHORT PASS | 0 | 0 | 9 | 0 | 0 | 7 | 7 | 0 | 0 | 0 | 0 | 0 | 0 | 0 | 0 | 0 | 3 | 0 | 0 | 5 |

PULSE ANALYZING METHOD AND APPARATUS

This application is a continuation of application Ser. No. 07/972,992, filed Nov. 10, 1992 now abandoned, which is a continuation-in-part of application Ser. No. 07/473,976, filed as PCT/GB88/00018 Oct. 21, 1988, now abandoned.

FIELD OF THE INVENTION

This invention relates to apparatus for and a method of pulse analysis, in particular to select broadband wanted signals from a signal conglomerate represented as a set of data samples and which also includes unwanted signals.

BACKGROUND OF THE INVENTION

The invention makes use of ordinal value filters and a brief explanation of the art relating to these filters is appropriate before describing the invention.

A real time ordinal value filter which determines which one of a set of R applied data values in the Nth-largest, becomes a median filter if R is odd and N is made equal to (R+1)/2. In such a mode the filter provides as an output the "middle" value of the data set, having in general an equal number of other data values from the set larger and smaller than itself.

The design and operation of median filters is described inter alia in U.S. Pat. Nos. 4,441,165, 4,439,840, 4,560,974 and 45135440.

In a simple case of linear array of data samples, if R=3 and N=2, the median value is the middle value of each three successive data values when the letter are sorted into order, beginning with the smallest and ending with the largest of each group of three. Since there is no averaging the median filter will remove spurious samples without degrading sharp transitions in the original sample series. Put another way, if the data samples represent a regularly sampled, time dependent signal, then the median filter has the property of not restricting the band width of the signal (which would degrade steep transitions in the original signal) but instead allows original signal transitions, representing long duration features, to be transmitted at full band width while substantially attenuating shorter duration spurious spikes, characteristic of electrical noise.

The particular threshold at which such a filter will eliminate spurious signals but pass other signals is determined by the values of R and N. The greater the number of atypical samples that represent the spurious signal that is to be eliminated, the greater will have to be the value of R.

However, it has been found that a median filter, set to eliminate spurious signals represented by less than N samples for example, may actually introduce spurious signals into the filter output, if transitions of the original signal (relating to the information) are closer together than N sampling intervals. Such spurious signals have the effect of increasing the number of samples representing the true signal event. This can have serious repercussions if the information is contained, at least in part, in the number of samples representing the amplitude excursions in the original.

In an attempt to further enhance noise reduction, it has been proposed to repeat a median filtering step by applying the filtered signal from a first median filter, either to the input of the same filter again or to a second identical filter. At first it was thought that this might overcome the introduction of spurious signals as discussed above, but it has been found that this repeated ordinal value filtering does not remove all spurious signals introduced by the first ordinal value filter.

Experiments have shown that the introduction of adventitious information into the filter output is reduced when the value of R is small. For example, in the case of a linear sequence of samples, if R=3, it would appear that there is little likelihood of any spurious additional signals appearing in the output. By appropriate choice of sampling interval, a median filter with a value of R=3 should not introduce any unwanted signal transitions in the filter output signal. However, spurious signals represented by three or more samples will not be suppressed, which when the sampling rate is high, may not result in very satisfactory noise reduction.

Increasing the number of samples representing a given signal will not necessarily result in an increase in the accuracy of the filtered signal since the value of R has to be increased to take account of the greater number of sampling intervals which will have occurred during a given spurious noise signal spike.

The present invention seeks to overcome this apparently fundamental problem associated with ordinal value filters (and median filters in particular), when they are employed to remove unwanted signals from a signal conglomerate containing broadband wanted signals.

SUMMARY OF THE INVENTION

The invention provides a succession of ordinal filters, each receiving the output of the previous filter as its input. The filters progress in value from N (less than M) to M (less than the number of data samples). The outputs to the filters are selected and added (including sign) to produce an output signal containing only pulses represented by the selected data samples.

Thus, the invention provides a method of pulse analysis which includes ordinal value filtering to remove unwanted items of data from wanted items of data in a conglomerate of items, comprises the steps of:

(i) selecting a group of the items from the conglomerate,
(ii) processing the selected items of data by successive ordinal value filtering with increasing order, to provide a first data output,
(iii) selecting at least one different group of the items from the conglomerate and processing each different group by the same succession of increasing order ordinal value filtering to provide second and subsequent data outputs, and
(iv) either applying the succession of data outputs as the filtered output or combining the succession of data outputs with other data, to form the filtered output signal.

Where the conglomerate of items of data is in one dimension (e.g. a series of electrical signals whose amplitude varies, and spaced by distance and/or time) the selected groups may comprise groups of successive ones of the varying amplitude signals.

Where the conglomerate of items of data is in two dimensions, (e.g. sampled values of an electrical signal arising from the scanning of a succession of lines in a television type scanner) the selected groups may comprise successive similar arrays of the sampled values, each group including sample values from two or more lines of the original scanning so that each group can be thought of as relating to a small area of the total scanned area.

The present invention therefore, also provides a method of pulse analysis which includes ordinal value (for example median) filtering to remove spurious noise spikes ranging in duration, area or volume, from one signal sample up to a maximum of (M−1) samples, in which the filter comprises a series of ordinal value filters (typically median filters), of increasing order, and the number of samples included in the groups applied to the succession of filters together with the geometrical arrangement of the samples in each group is selected to produce the derived properties of the overall filter.

An overall filter can be referred to as a data-sieve.

A data-sieve is designed as follows:

(1) Two masks are used to characterize any particular filter. A first mask S2 is used to identify all samples (items) to be included in the final filter of the series of filters.

(2) The position of one of the samples encompassed by the first mask S2 is then chosen as the origin of the first mask, and a second mask S1 (smaller than S2) is centered on the origin of S2 so as to encompass a subset of the samples within by S2.

(3) The samples to be included in the first ordinal value filter (order 1) can then be identified as those outside S1 but inside a circular window centred on the selected origin with a radius such that the window just includes those samples which lie just outside S1.

(4) The samples to be included in the second ordinal value filter (order 2) can be identified by incrementing the radius of the circular window until the next subset of samples lying outside S1 are also encompassed by the window.

(5) The radius of the window is successively incremented to define third and subsequent windows, until a window is defined which encompasses all the samples lying between S1 and S2, (which comprises the final ordinal value filter, order M).

If S1 is vanishingly small, the sample values between S1 and S2 for the first order filter, will simply compose the sample located at the origin, and since an ordinal value filter leaves such a sample unchanged, the first order filter can, in practice, be ommitted from the series.

(In the case of a two dimensional lattice of samples, the first mask may, for example, be generally circular. In the case of a single dimensional array, this mask will be linear and be orientated so as to encompass a linear group of the samples. The mask shape does not have to be symmetrical).

The data-sieve may be used as follows to filter a signal:

(a) A signal is first filtered using an ordinal value filter (commonly a median filter) of order 1.

(b) Subsequently the output from the order 1 filter is filtered using an ordinal value filter of order 2, and thereafter each filter output is filtered successively with filters of increasing order to a final filtering step where the filter is of order M.

Typically the data samples are arranged in either a one or a two dimensional regular array. The characteristics of a filter such as described above will not normally change in the course of scanning the full sample set.

The method of pulse analysis may be realized by providing a cascade of different ordinal value filters connected in series from ordinal value 1 to ordinal value M, with the output of each filter supplying the input to the next in the line, each filter in the line having a higher order than the previous one.

Alternatively the method of pulse analysis may include the steps of adjusting the order value of a single ordinal value filter through the range 1 to M, instead of using a plurality of different filters, and storing the output signal from each filtering operation whilst the filter value is changed to the next value, before it is supplied to the input of the changed filter. By storing each subsequently filtered signal and incrementally increasing the filter order from 1 to M, the final stored signal will comprise the desired filtered signal for output purposes.

Whilst the series connection of M different filters to form a data-sieve allows a stored array of samples, in one or more dimensions, to be scanned, an alternative method is to have a plurality of data-sieve arranged in an array that simultaneously filter a corresponding plurality of input signals.

The invention is applicable to low pass filtering (as so far described) but may also be applied to high pass filtering and bad pass filtering.

If a high pass filter is required, the output from the highest order filter must be subtracted from the raw data. The resulting signal will then only include all signals not eliminated by the data-sieve.

If a band pass filter is required, the output from one of the ordinal value filters in the chain must be subtracted from the output of an earlier one.

The invention also lies in pulse analysing apparatus which includes an ordinal value filter in which the order value is adjustable, together with a means for incrementing the order by 1 after each successive application of data thereto, with storage means associated with the input (and/or output) of the filter, for storing the filtered signals and supplying the stored signal to the input of the filter for a subsequent pass through the filter.

Preferably means for counting is provided to determine when a desired order value has ben achieved to terminate the process and release the stored information as an output signal.

The invention also lies in pulse analysing apparatus comprising a plurality of ordinal value filters connected in series with the output of the first connected to the input of the second and so on with each successive filter having an increasing order from a low value associated with the first filter, to a high value associated with the last in the series. Typically the order value increments by 1 from one filter to the next in the series.

The invention may be applied to any information bearing signal whether derived from an optical to electrical converter such as a camera (TV or solid state), or from a transducer detecting sound or vibration or other varying physical, chemical, electro-chemical, atomic or particle activity.

The invention may be employed as a decoder or reliably separate pulses of one width from pulses of other widths and may for example be used in conjunction with pattern recognition apparatus to clean up information to be processed for pattern matching purposes. In this way the invention can be thought of as separating objects of one size from objects of another size.

The invention will now be described by way of example with reference to the accompanying drawings in which:

FIG. 1 schematically illustrates a pulse analyzing system in accordance with the invention;

Figure 4:
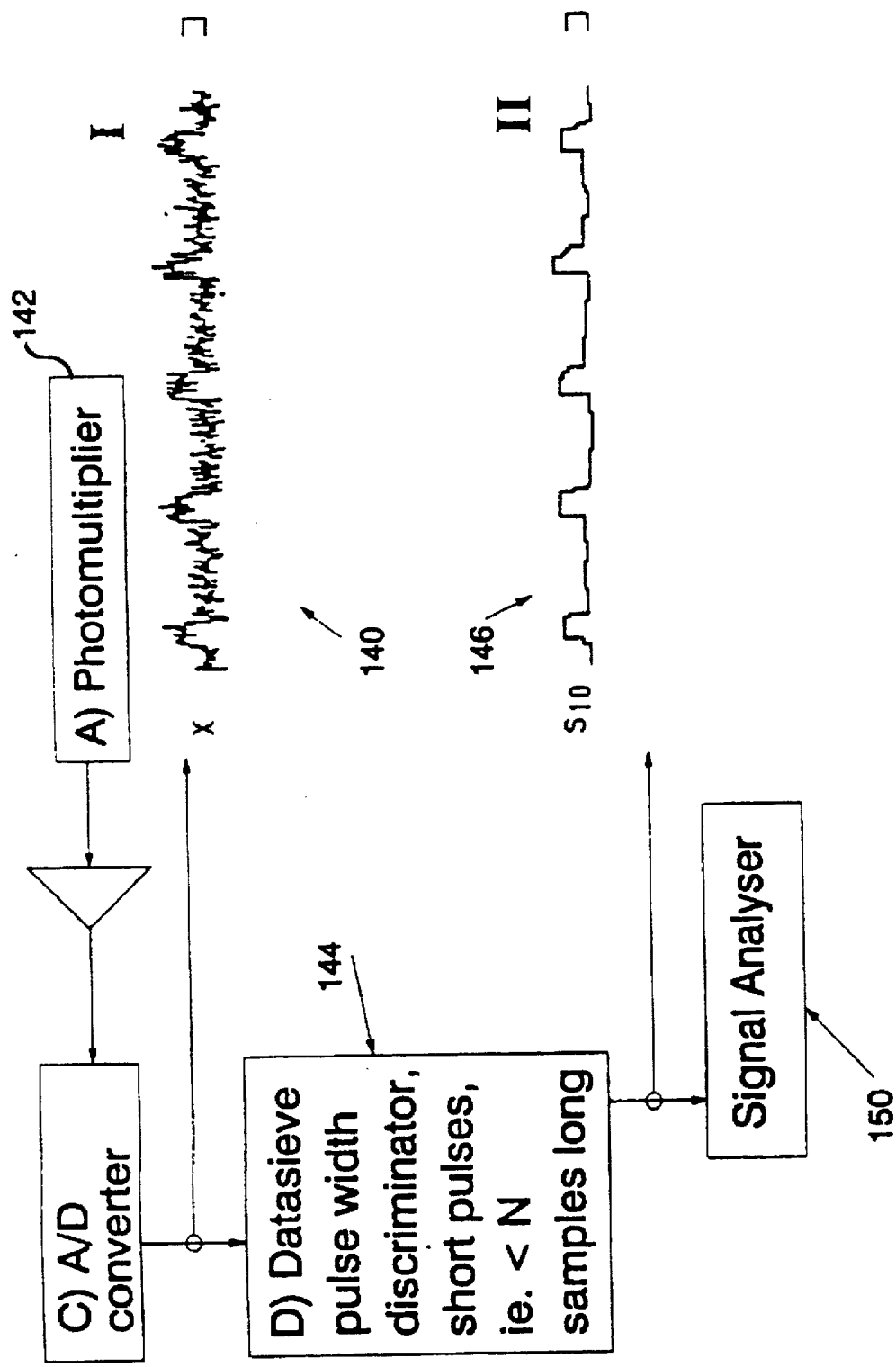
Figure 5:
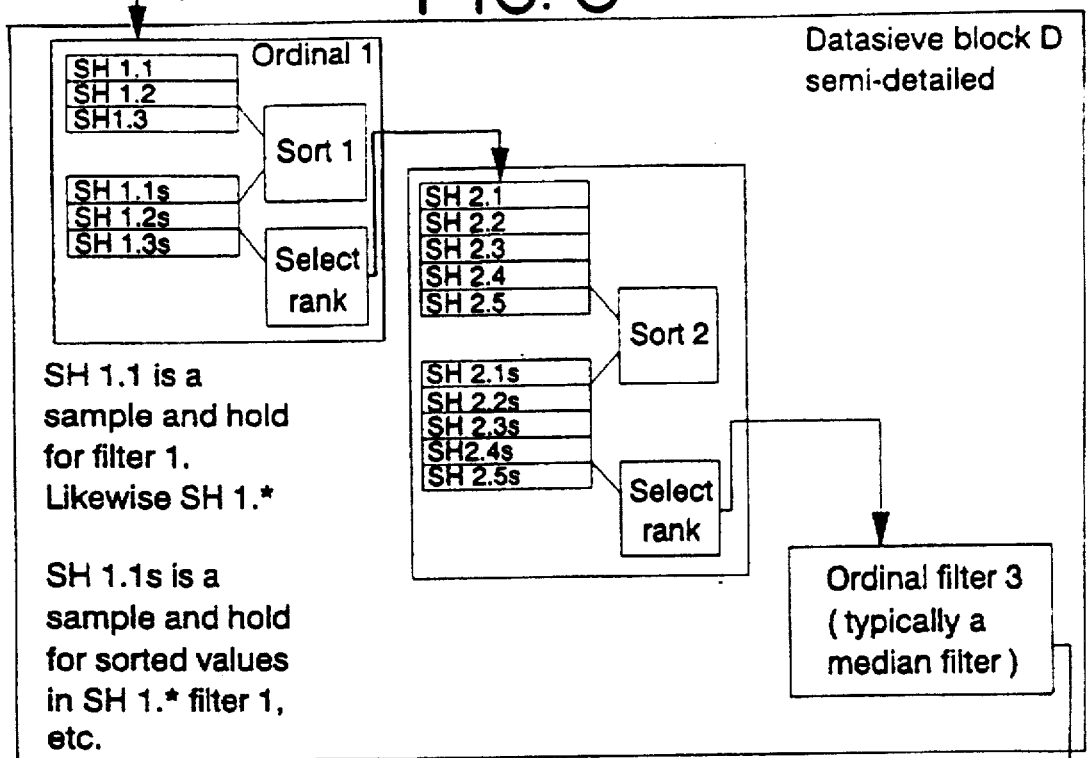
Figure 6:
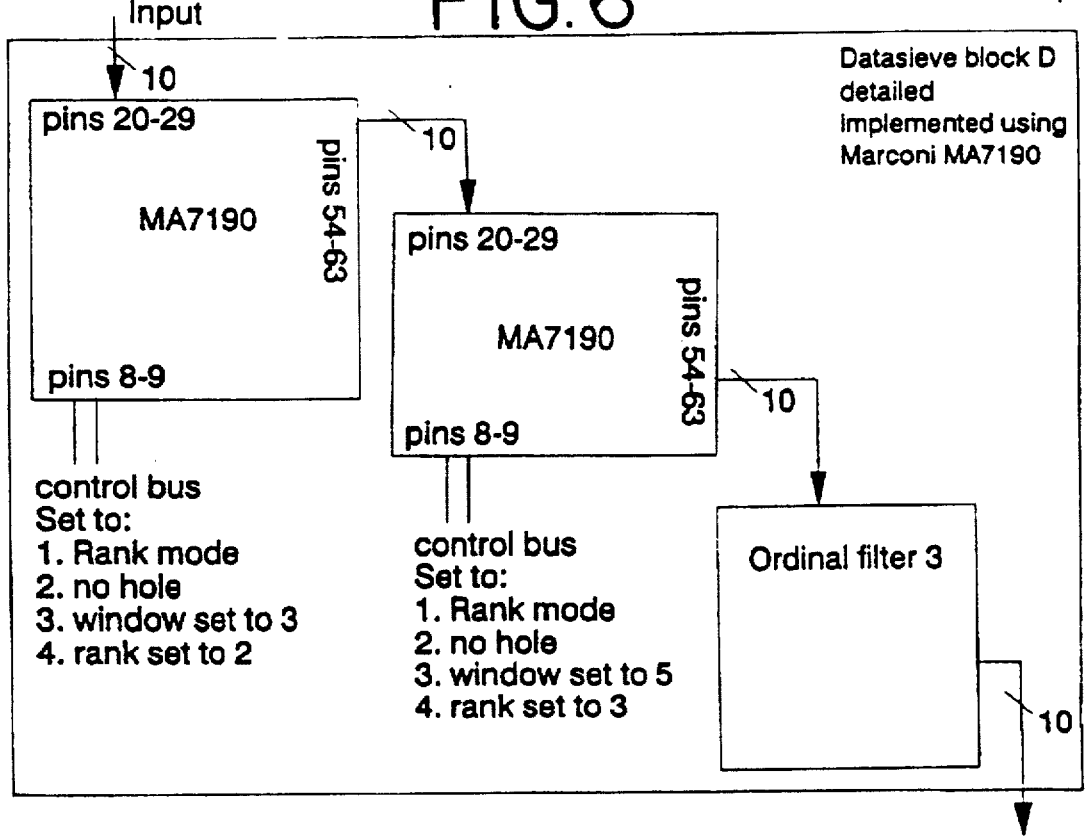
Figures 7, 8:
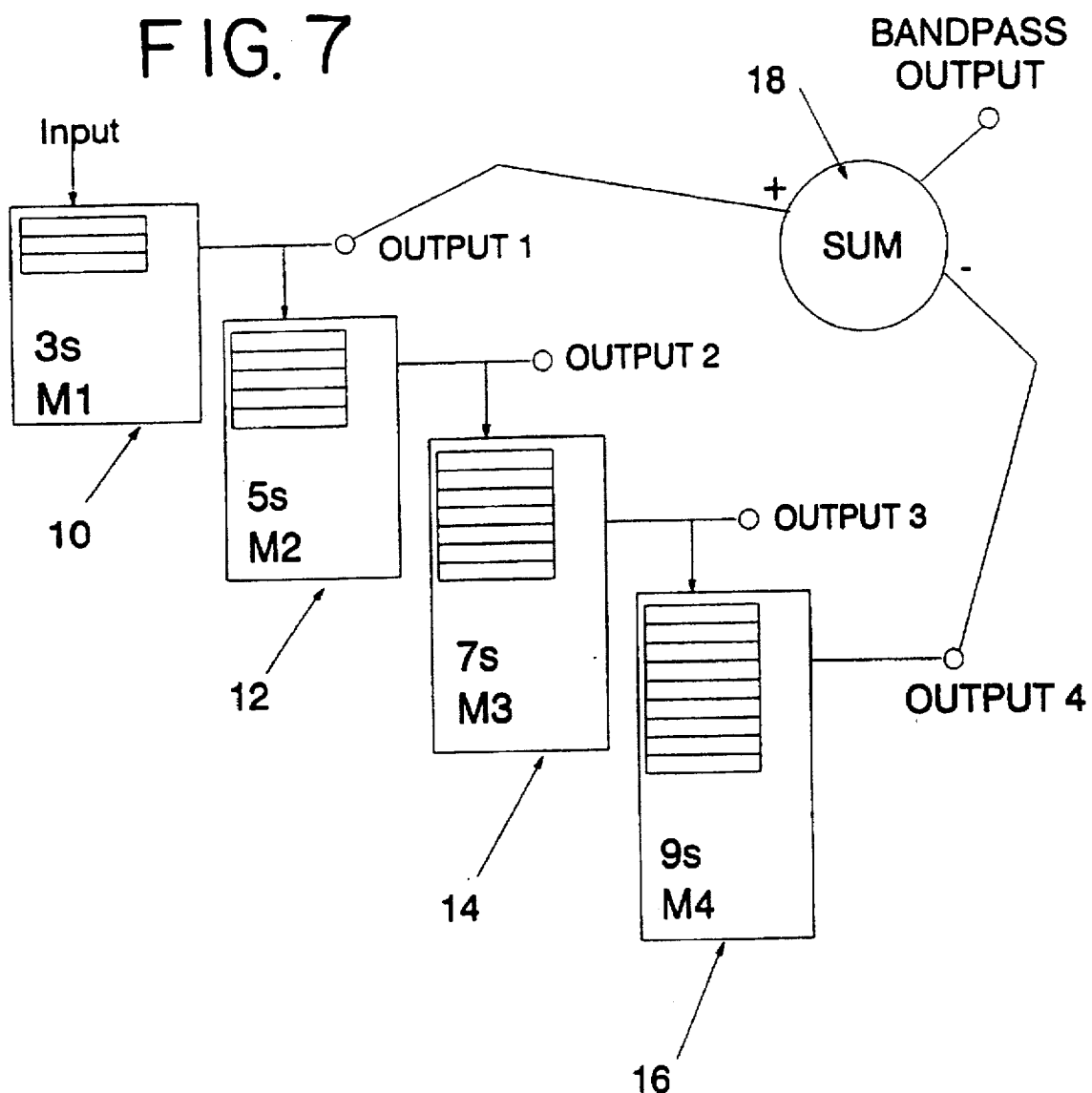

FIG. 4 schematically illustrates an alternative pulse analyzing system;

FIG. 5 is a circuit diagram of the alternative system;

FIG. 6 shows a practical embodiment of the circuit of FIG. 5;

FIG. 7 illustrates diagrammatically one embodiment of data-sieve, for simplicity a single dimension filter, and FIG. 8 is a table which illustrates the advantage of using the series of ordinal value filters, relative to single and repeat median filtering of data samples from one dimensional data.

Figure 9:
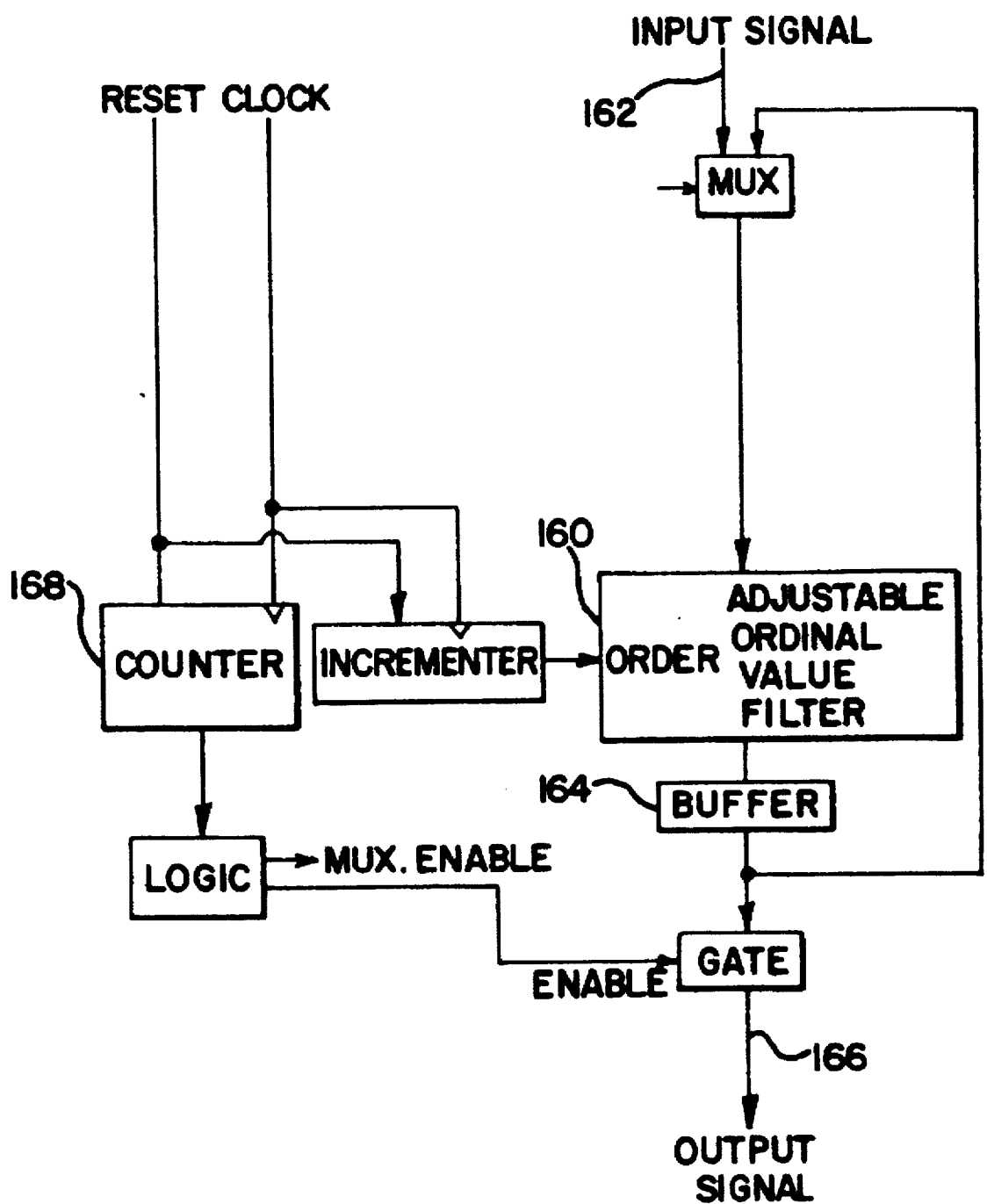

FIG. 9 is a circuit diagram of an alternative system.

Figure 10:
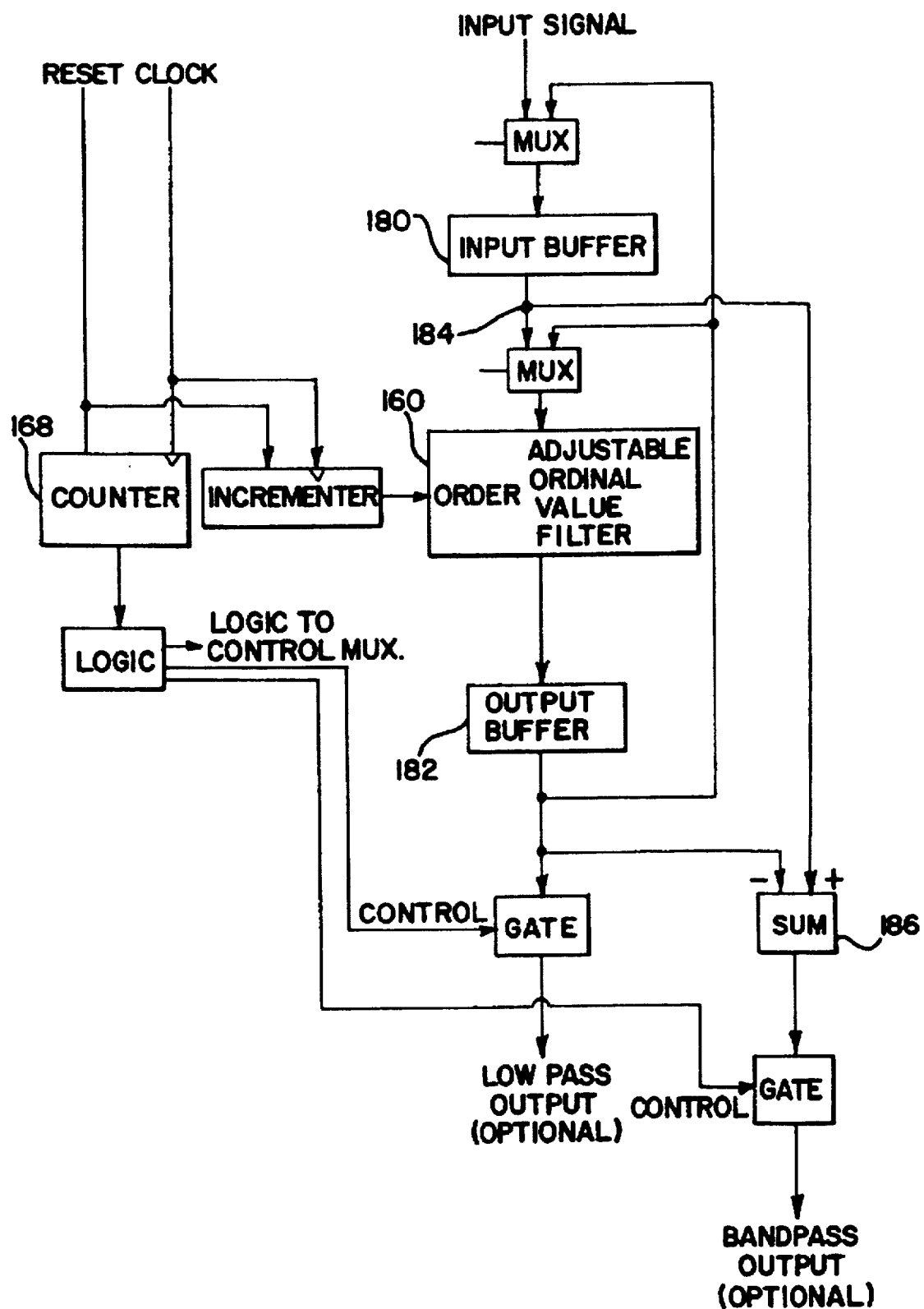

FIG. 10 is a circuit diagram of another alternative system.

Figure 11:
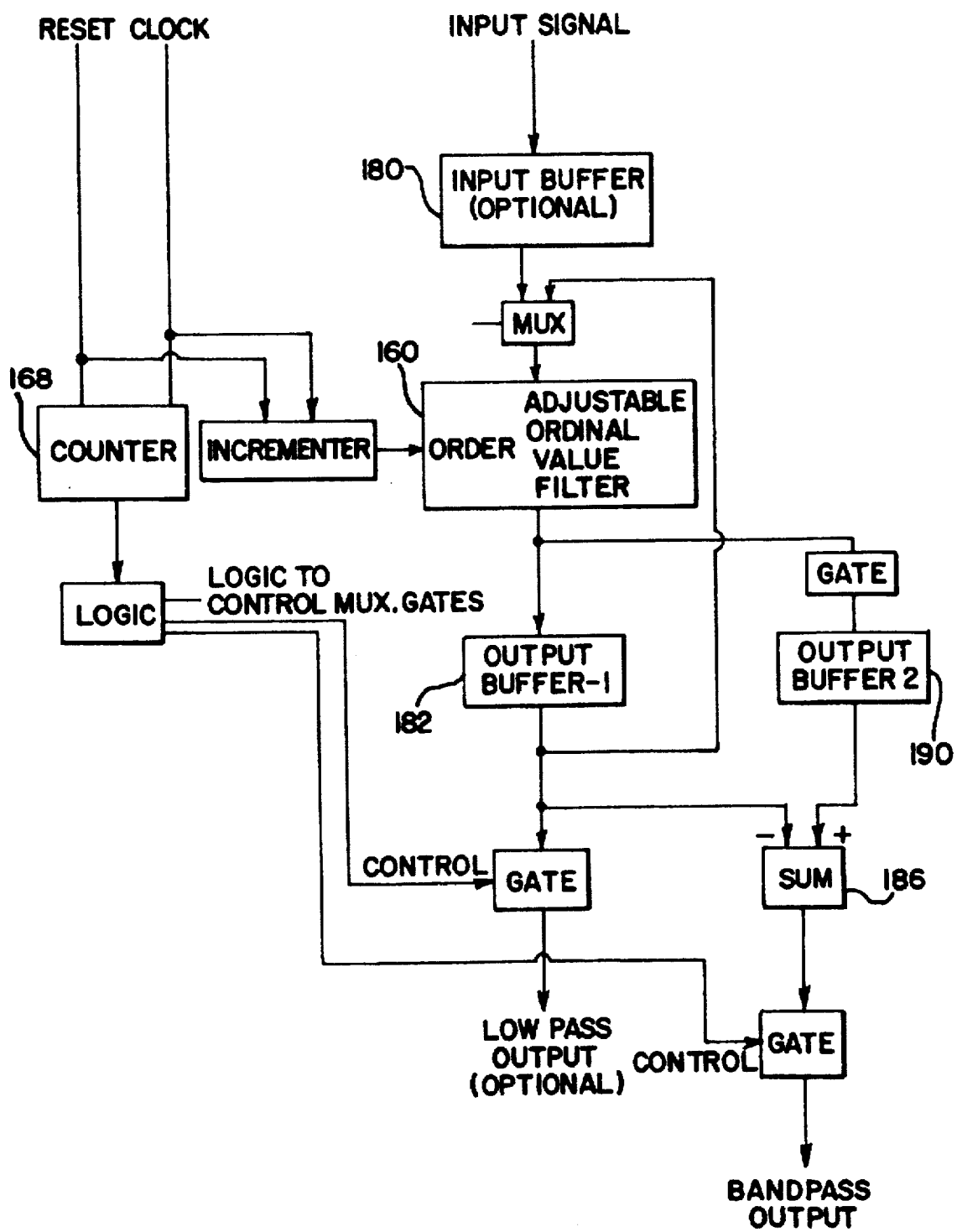

FIG. 11 is a circuit diagram of a further alternative system.

Figure 1:
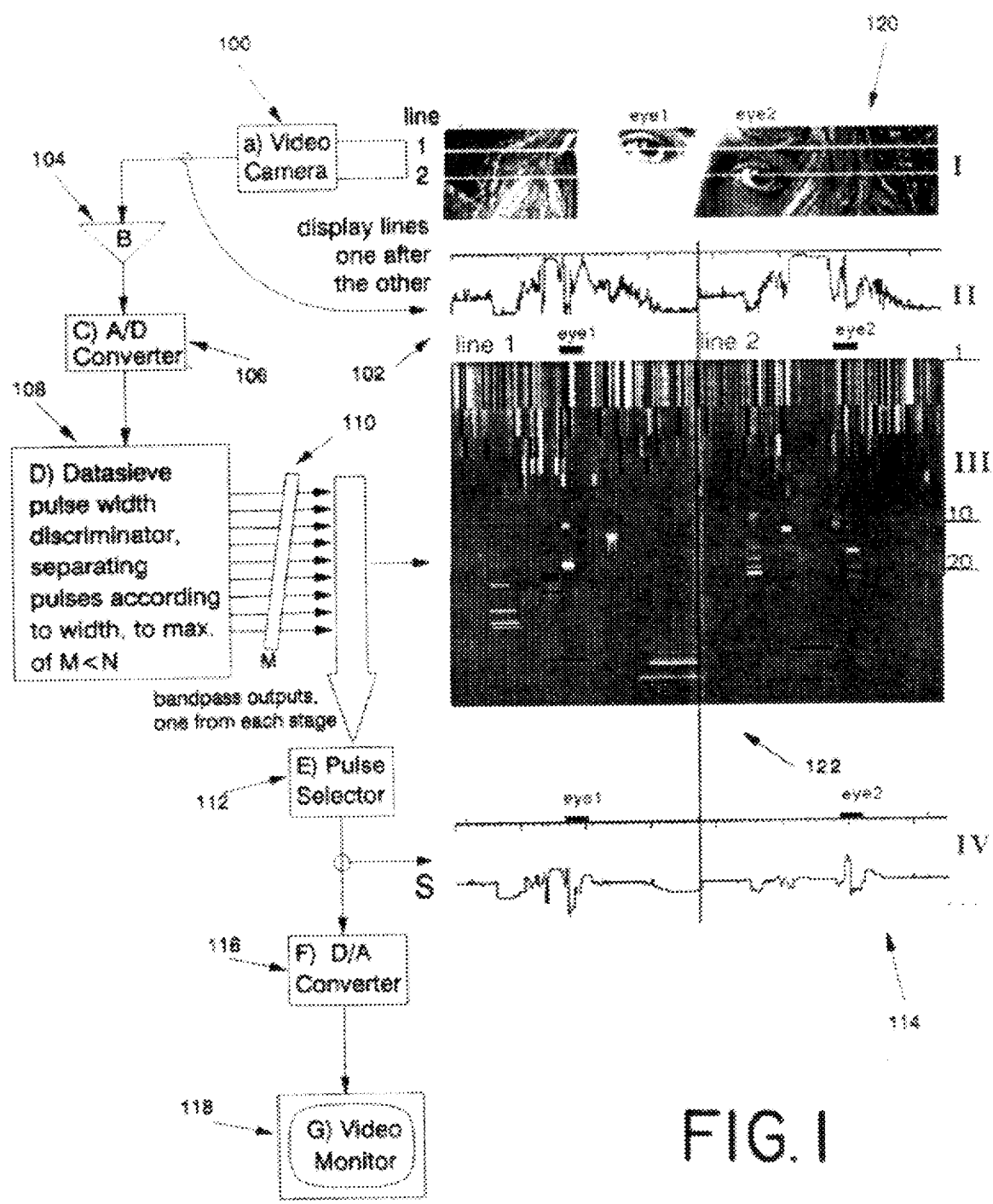

Referring to FIG. 1, there is depicted a video camera 100 supplying an analogue signal 102 through a buffer amplifier 104 and an A/D converter 106 to a data-sieve 108. The data-sieve comprises a succession of ordinal value filters of integrally increasing value, providing M bandpass outputs 110, one from each stage. Whilst the A/D converter is preferable, it is not essential, as the data-sieve 108 could operate on an analogue signal.

The data sieve 108 effectively comprises a pulse width discriminator of M states, the output of each stage being subtracted from its input to produce a bandpass output which contains pulses of width unique to that stage. Thus, the data-sieve decomposes the input signal into component pulses according to their widths.

The M outputs are taken to a pulse selector 112, which selects a predetermined subset of the pulses arising at its multiple inputs and adds them together to produce an output 114 containing only data pulses determined by the selection.

The signal 114 is passed through a D/A converter 116 to a video monitor 118, which displays an image synthesized by the pulse selector and so contains only those features of the input signal selected by the pulse selector 112.

On the right hand side of FIG. 1, part of the original image 120 is shown, white lines highlighting the two scan lines which produce the analogue signal shown at 102. Below this, the scan lines are shown at 122 broken down into a set of constituent pulses of different widths. Amplitude is shown by intensity, pulse width is plotted logarithmically along the vertical axis and the horizontal axis represents time. The output 114 more specifically shows the result of selecting the patterns of pulses which represent the eyes of the subject in the image 120 and recombining to form an amplitude modulated video signal. The unwanted (non-eye) signals are substantially attenuated.

Figure 2:
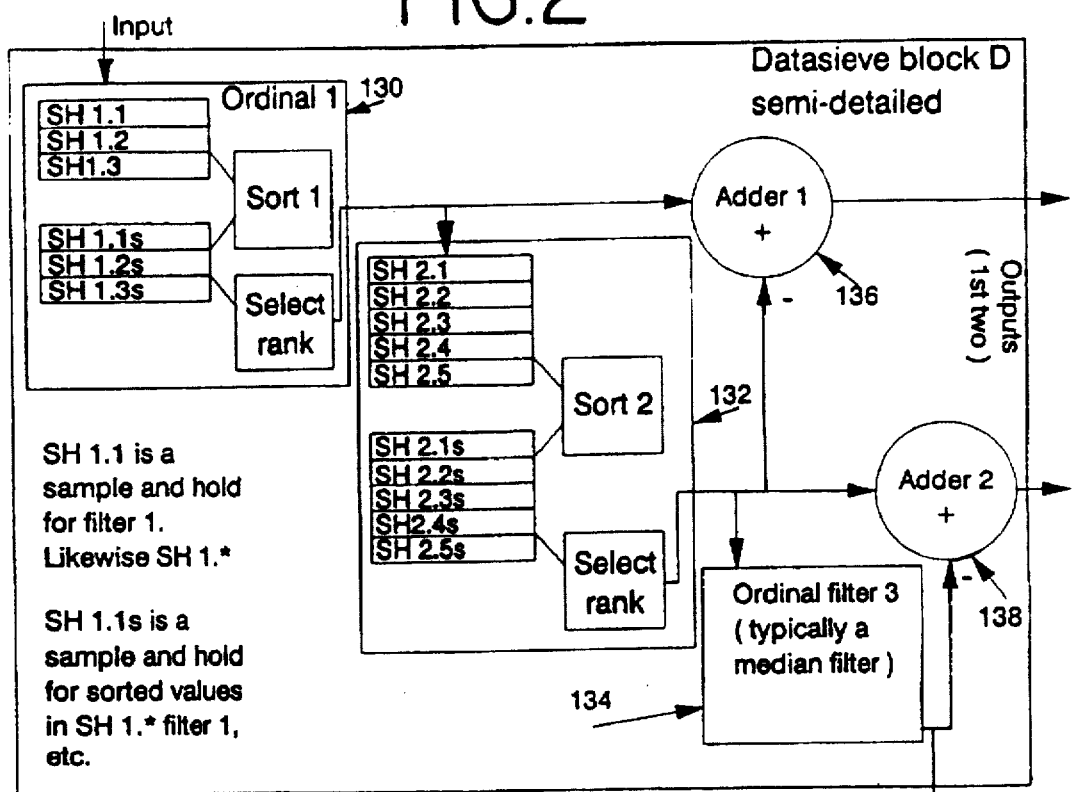
FIG. 2 is a circuit diagram of the system.

The circuit diagram of FIG. 2 exemplifies the system of FIG. 1, whilst FIG. 2 illustrates a practical realization of the circuit. In these two figures, reference 130 denotes an ordinal value 1 filter, reference 132 an ordinal value 2 filer and reference 134 an ordinal value 3 filter. Filters of ordinal value 4, 5 et seq follow, but are not depicted. Adders 136, 138 etc., provide outputs to the pulse selector.

FIGS. 4 to 6 show a modified system in analogous manner, applied to the output 140 of a photomultiplier 142. However, in this embodiment, pulse selection and adding is effected within the data-sieve 144, which constitutes a pulse width discriminator with M stages directly providing an output 146 without any, or at least with many fewer, short term pulses or impulses which are unwanted in the output supplied to the signal analyzer 150.

The photomultiplier 142 is shown providing an output 140 obtained by monitoring the fluorescence of a flow cytometer. This output 140 clearly comprises a basic wanted signal which can be represented as a series of pulses longer than M samples, together with random uncorrelated noise signals of short duration. The cleaned output at 148 is equally clear. Typically, this output contains only pulses of duration greater than 20 data samples.

It is again to be noted that the illustrated A/D converter is not essential.

Figure 3:
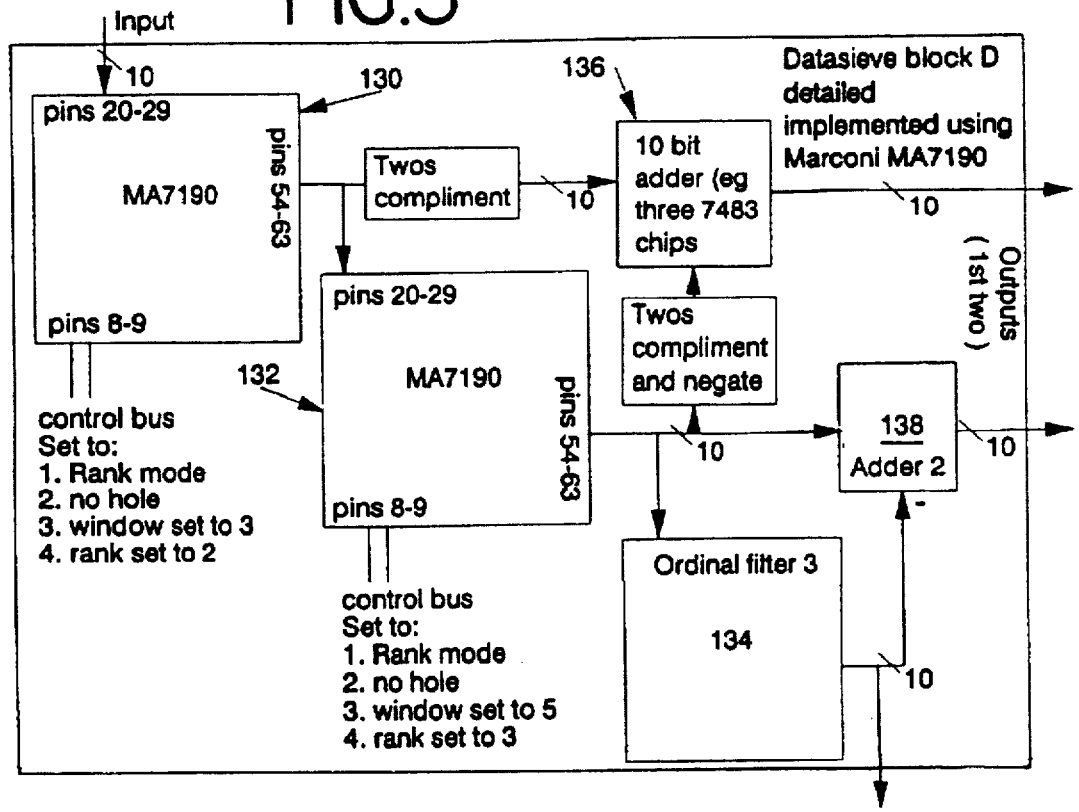
FIG. 3 shows a practical embodiment of the circuit.

The circuit diagram of FIG. 5 and the practical realization of FIG. 6 will be clear without detailed description, by analogy with the description of FIGS. 2 and 3. In this case, however, the required output is provided by the output of the final filter of the data-sieve. Pulse selection is effectively incorporated within the data-sieve.

A filter that processes samples, representing a signal in one dimension, with a mask window S1 encompassing no samples, and a final mask window S2 encompassing 9 samples, with a central origin, is shown in FIG. 7. The input signal is first filtered through an ordinal value filter 10 (in this case taking the median) or order 2, which encompasses 3 samples. The output is passed to a second conventional ordinal value filter 12, or order 3, and the output of this is passed to a third ordinal value filter 14 of order 4, whose output is passed to the fourth and last filter 16 or order 5.

The filters are sometimes described in relation to the minimum pulse within R (i.e. pulse duration) which will be passed by the filter, and in this context, the first filter (of order 2) a window width of three samples (i.e. R=3) will remove pulses represented by less than two samples.

The second filter (or order 3) has a window of width of five (i.e. R=5) samples and therefore removes pulses represented by less than 3 sample etc.

The window widths R are not constrained to odd numbers of samples, although the nature of median filters and of single dimensional data streams makes it normally convenient to design median filters for use with single dimensional data streams in this way.

A bandpass filter can be produced by subtracting a later output from an earlier one, such as shown in FIG. 7, in which a sampling amplifier constructed as a subtraction stage, is connected between Output 1 and Output 4.

A high pass filter (sometimes referred to as a short pass filter) can be produced by subtracting the final output from the original input signal.

The table of FIG. 8 illustrates how the present invention is an improvement over a signal or multiple pass median filter and also illustrates the high pass filter characteristic in the bottom line of the table.

The top line of the table indicates nineteen sampling intervals along an electrical signal.

Row 1 of the table illustrates numerical values which might be found at the different sampling points in a typical data signal. Thus at position 3 a spurious noise spike of one sampling pulse interval duration and having an amplitude of nine units is found. A similar noise spike of two sampling intervals duration (but having a smaller amplitude of seven units) is found at positions 7 and 8. A true information amplitude excursion is found at positions 12, 13 and 14 having an amplitude of three units and thereafter a typical drifting base line situation is illustrated with a spurious noise spike of three units superimposed over the base line in that positions 15 to 19 have values of 1, 1, 4, 1, and 1 respectively.

If we consider this signal applied to the single median filter of window width 5 the output from the filter will be as shown in Row 2. Such a filter has a total window width of five sampling points (2N–1) and from a study of Row 2 it will be seen that the whole of the true information amplitude excursion will be transmitted by the filter, an additional extra sampling interval will be added at position 15 to extend the trailing edge of the true amplitude excursion and filter will produce for the remaining sampling positions 16, to 19 a value 1.

This demonstrates how a simple median filter having a value of N=3 will be confused if a second significant excursion (whether a true one or otherwise) follows the trailing edge of a previous true excursion by a distance (i.e.

number of sampling intervals) less than the N value of the filter concerned. In the example shown the N value is 3 and the sampling point spacing between the trailing edge of the true excursion at 14 and the leading edge of a noise spike at 17 is only two sampling intervals. As a consequence the trailing edge of the true pulse is extended by one sampling interval.

Row 3 of the table illustrates the effect of repeating the median filtering using the same median filter (or another median filter having the same N value) and it will be noted that the corrupted value of the true information excursion in the original signal still appears in the output of the median filter. In fact were the signal to be passed through the median filter an infinite number of times, the width of the pulse beginning at position 12 would remain unaltered and the same incorrect pulse would appear at the output of the filter every time.

If now a filter constructed in accordance with the invention is used the result will be as shown at Row 4 of the table. Here the first steps of the filter has an N value of 2 and the second an N value of 3, so that the overall result will be exactly the same i.e. all pulses having a duration of less than 3 sampling intervals will be eliminated. Note however, that in this case the length of the true information excursion in the original data is not corrupted by the addition of a false value at point 15 and the output from the second stage of the two stage filter is a true representation (within the limits of the sampling accuracy) of the original data.

Note also that in both cases the last positions of the output signal also register level 1, since the change in base line value of the signal has extended over a period of more than three sampling intervals. However, the spurious pulse sitting at position 17 is not seen and the value at this point is reduced to the pedestal value of 1, corresponding to the base line value at positions 15, 16, 18 and 19.

Row 5 illustrates how the device can be turned into a short pulse filter in which all pulses of three sampling intervals or greater duration will be discarded and only pulses having shorter durations (i.e. of one or two sampling pulse intervals) will be passed. This is achieved by subtracting the output corresponding to Row 4 of the table from the original data. In this way the noise spikes at position 3, positions 7 and 8 and at position 17 will appear in the output of the subtraction stage but the information excursion bridging positions 12, 13 and 14, and more importantly still the pedestal appearing at points 15 to 19, will be removed.

It is of interest to note that the noise spike at position 17 is also shown at its correct amplitude of three units relative to the drifting base line, rather than the four units (relative to zero) as shown in Row 1.

This simple example has been given to show how a cascade of steadily increasing window width median filters will give greater accuracy than when a single median filter is used whether or not the filtering step using the single filter is repeated.

In an alternative arrangement as shown in FIG. 9 the four median filters shown in FIG. 7 may be replaced by a single median or ordinal value filter 160 (having adjustable N=value) provided the input information 162 can be stored in a convenient memory 164 (such as a "first in first out" (F.I.F.O) memory device) after each passage through the filter 162, to enable it to be recycled through the filter a number of times with the N value of the filter being increased with each successive pass. The final resulting signal which passes into the memory after the last pass through the filter will correspond to the desired filtered version of the input signal 162 and can be provided as the output signal 166 by appropriately redirecting the output of the memory device away from the input of the median filter, to an output of the filter. This may be achieved automatically by a counter 168 which simple counts the number of cycles and gates the output of the memory device when the required number of cycles has been completed.

Where the original data must be retained two "first in first out" (F.I.F.O) memories may be provided as shown in FIG. 10, one to store the original data, and the other memory 182 to act as a buffer and store the filtered version of the original data, and then the subsequent filtered version of the contents of the buffer as it is recycled through the median or ordinal value filter 160. In this arrangement the output 184 from the first memory may need to be recycled as it is read into the input of the median filter on the first occasion, so as to act as a refresh for the memory and thereby preserve the original data.

The output from the second F.I.F.O memory 182 associated with the output of the median filter is applied to the input of the median filter after the original data has been secured in the first F.I.F.O memory, to filter the first signal this time with a higher N value. Recycling is continued with step-wise increase of N value as previously described and at the end of an appropriate number of cycles, the signals stored in the second F.I.F.O memory 182 will correspond to the final filtered signal whilst the original data remains in the first memory 180.

If a high pass filter is required (i.e. the elimination of pulses of duration greater than a particular number of sampling intervals) then the two memories 180 and 182 can be read out simultaneously to a suitable arithmetic stage 186 adapted to subtract one from the other.

If a bandpass filter effect is required than the information in the first memory 180 must be replaced with the output from the appropriate one of the median or ordinal filter steps during the sequence of filtering steps and the output from the first and second memories again subtracted at the end of the process.

If the first memory 180 must preserve the original data for other purposes, a third memory 190 will be required for storing the output from the intermediate median filtering step as shown in FIG. 11.

One embodiment for use in the pulse analyzing system of the invention thus comprises a multiple stage filter comprising M−1 ordinal value filtering stages connected in series, each stage being a conventional median filter and the filter width of each stage is incremented by two starting with the first filter of width three. The output of the cascade filter behaves as a low pass data-sieve removing signals and noise that occupy widths of less than N sample intervals in the data stream. As described high pass and bandpass filters can be constructed by subtracting the output of later stages from either the input or an intermediate stage.

Although the methods and apparatus described herein have tended to imply the presence of electrical signals, it is to be understood that the invention is not limited to systems which employ/generate electrical signal but is equally applicable to any system, such as an optical system where the information is in the form of modulated light beams.

I claim:

1. Apparatus for producing an electrical signal conglomerate including wanted electrical signals and unwanted electrical signals, and for selecting the wanted electrical signals from the electrical signal conglomerate, comprising:
   (i) an electronic scanning device for producing the electrical signal conglomerate;
   (ii) an analog to digital converter for digitizing the electrical signal conglomerate;

(iii) a succession of ordinal value filters of order integrally increasing from N (less than M) up to M for filtering the digitized electrical signal, each filter producing an output and the output of each filter serving as the input to the next filter in the succession except for the last in the line;

(iv) means for forming a succession of bandpass filter outputs by subtracting each filter output from its respective input;

(v) means for selecting a subset of values from the succession of bandpass output signals; and (vi) means for adding the values of the selected subset to produce an electrical output signal representing the sum of the selected subset of values and thereby containing only the wanted electrical signals.

2. Apparatus for producing a digitized electrical signal conglomerate including wanted electrical signals and unwanted electrical signals, and for selecting the wanted electrical signals from the electrical signal conglomerate, comprising:

(i) an electronic scanning device for producing the digitized electrical signal conglomerate;

(ii) a succession of ordinal value filters of order integrally increasing from N (less than M) up to M for filtering the digitized electrical signal conglomerate, each filter producing an output and the output of each filter serving as the input to the next filter in the succession except for the last in the line;

(iii) means for forming a succession of bandpass filter outputs by subtracting each filter output from its respective input;

(iv) means for selecting a subset of values from the succession of bandpass output signals; and (v) means for adding the values of the selected subset to produce an electrical output signal representing the sum of the selected subset of values and thereby containing only the wanted electrical signals.

3. A method of signal analysis of an electrical signal, made up of electrical signal pulses whose widths are related to the size of objects in a scanned image together with electrical noise signals, comprising the steps of:

(i) scanning an image containing objects of different sizes to produce an analog electrical signal;

(ii) converting the analog signal to a digital signal;

(iii) ordinal value filtering at least a selected part of the digitized signal with a succession of filters of order increasing from N to M, producing an output signal from each filter, the input signal to each filter being the output signal from the previous filter in the succession;

(iv) selecting a predetermined pair of the filter outputs;

(v) producing an electrical output signal by subtracting one filter output from the earlier filter output of the said pair, so that the output signal contains only pulses within a range of widths determined by the two filters; and (vi) applying the said electrical output signal to a signal analyzer to allow output signals relating to objects of one size to be separated from output signals relating to objects of another size.

4. A method of signal analysis of an electrical signal, made up of electrical signal pulses whose widths are related to the size of objects in a scanned image together with electrical noise signals, comprising the steps of:

(i) scanning an image containing objects of different sizes to produce an analog electrical signal;

(ii) converting the analog signal to a digital signal;

(iii) ordinal value filtering at least a selected part of the digitized signal with a succession of filters of order increasing from N to M, producing an output signal from each filter, the input signal to each filter being the output signal from the previous filter in the succession;

(iv) selecting an output from the succession of filter outputs;

(v) applying the selected output signal to a signal analyzer to allow the output signal relating to objects in the image of one size to be separated from output signal relating to objects of another size.

5. A method of generating a pattern of pulses which represent a feature of an image to reduce the data obtained from scanning the image for onward transmission for processing comprising the steps of:

(i) producing a digitized video signal by scanning an image containing objects which during scanning produce electrical pulses of different widths;

(ii) ordinal value filtering at least a selected part of the digitized signal with a succession of filters of order increasing from N up to M, producing an output from each filter, the input signal to each successive filter being the output signal from the previous filter in the succession and producing a band pass signal output containing zero, one or more pulses, each of which corresponds to a succession of equal value digital samples by subtracting each filter output from the output of the previous filter in the succession;

(iii) selecting from the output pulses contained within the band pass signal outputs a predetermined subset of the pulses;

(iv) combining the pulses of the subset to produce an electrical output signal whose amplitude is the sum of the value of all the pulses in the subset; and (v) supplying the said electrical output signal for onward transmission as the image data signal for subsequent processing.

* * * * *